(12) United States Patent
Honma

(10) Patent No.: US 9,683,290 B2
(45) Date of Patent: *Jun. 20, 2017

(54) SUBSTRATE PROCESSING APPARATUS HAVING A PILLAR SUPPORT STRUCTURE FOR PREVENTING TRANSFORMATION OF A CEILING PORTION

(71) Applicant: TOKYO ELECTRON LIMITED, Tokyo (JP)

(72) Inventor: Manabu Honma, Oshu (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/007,488

(22) Filed: Jan. 27, 2016

(65) Prior Publication Data

US 2016/0222509 A1    Aug. 4, 2016

(30) Foreign Application Priority Data

Feb. 4, 2015   (JP) .................................. 2015-020536

(51) Int. Cl.
*C23C 16/44* (2006.01)
*H01L 21/687* (2006.01)
(Continued)

(52) U.S. Cl.
CPC ...... *C23C 16/4409* (2013.01); *C23C 16/4584* (2013.01); *C23C 16/45551* (2013.01);
(Continued)

(58) Field of Classification Search
CPC ................ B05D 3/04; C23C 16/45544; C23C 16/45561; C23C 16/45576;
(Continued)

(56) References Cited

U.S. PATENT DOCUMENTS 3,696,779 A * 10/1972 Murai .................... C30B 25/14
                                                          118/725
4,389,973 A *  6/1983 Suntola ................. C23C 16/306
                                                          118/715
(Continued)

FOREIGN PATENT DOCUMENTS

JP       2010-56470 A       3/2010

*Primary Examiner* — Karl Kurple
(74) *Attorney, Agent, or Firm* — Nath, Goldberg & Meyer; Jerald L. Meyer

(57) ABSTRACT

There is provided a substrate processing apparatus of performing a process by supplying a processing gas on a substrate while rotating the substrate mounted on a rotary table in a vacuum container, which includes: a container main body used as a part including a bottom portion of the vacuum container; a cover part configured to be detachably installed with respect to the container main body to open and close the container main body, the cover part being used as a part including a ceiling portion of the vacuum container; a pillar installed in one of the cover part and the container main body such that the pillar penetrates through a central portion of the rotary table when the cover part is installed on the container main body, and configured to support the cover part with respect to the container main body when the inside of the vacuum container is vacuum-exhausted.

6 Claims, 12 Drawing Sheets

(51) Int. Cl.
*C23C 16/455* (2006.01)
*C23C 16/458* (2006.01)

(52) U.S. Cl.
CPC .. *C23C 16/45578* (2013.01); *H01L 21/68771* (2013.01); *H01L 21/68792* (2013.01)

(58) Field of Classification Search
CPC ............ C23C 16/4584; C23C 16/4586; H01L 21/68764; H01L 21/68785; H01L 21/68792
See application file for complete search history.

(56) References Cited

U.S. PATENT DOCUMENTS

| | | | | |
|---|---|---|---|---|
| 4,413,022 A | * | 11/1983 | Suntola | C23C 16/306 117/89 |
| 5,281,274 A | * | 1/1994 | Yoder | C30B 25/02 118/697 |
| 5,807,792 A | * | 9/1998 | Ilg | C23C 16/44 257/E21.275 |
| 6,575,737 B1 | * | 6/2003 | Perlov | H01L 21/67103 118/719 |
| 6,634,314 B2 | * | 10/2003 | Hwang | C23C 16/45525 118/715 |
| 7,175,713 B2 | * | 2/2007 | Thakur | C23C 16/4412 118/715 |
| 8,808,456 B2 | * | 8/2014 | Kato | C23C 16/401 118/716 |
| 9,267,204 B2 | * | 2/2016 | Honma | C23C 16/45551 |
| 2008/0193643 A1 | * | 8/2008 | Dip | C23C 16/45508 427/255.5 |
| 2015/0211122 A1 | * | 7/2015 | Chang | G06F 17/18 156/345.27 |
| 2016/0027672 A1 | * | 1/2016 | Asakawa | H01L 21/67126 438/706 |
| 2016/0032457 A1 | * | 2/2016 | Tanabe | C23C 16/4585 118/666 |
| 2016/0215395 A1 | * | 7/2016 | Honma | C23C 16/45544 |
| 2016/0222509 A1 | * | 8/2016 | Honma | C23C 16/4409 |

* cited by examiner

FIG. 4
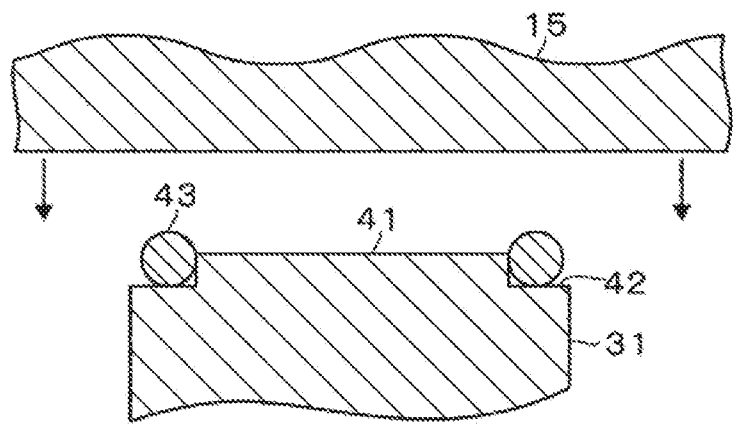
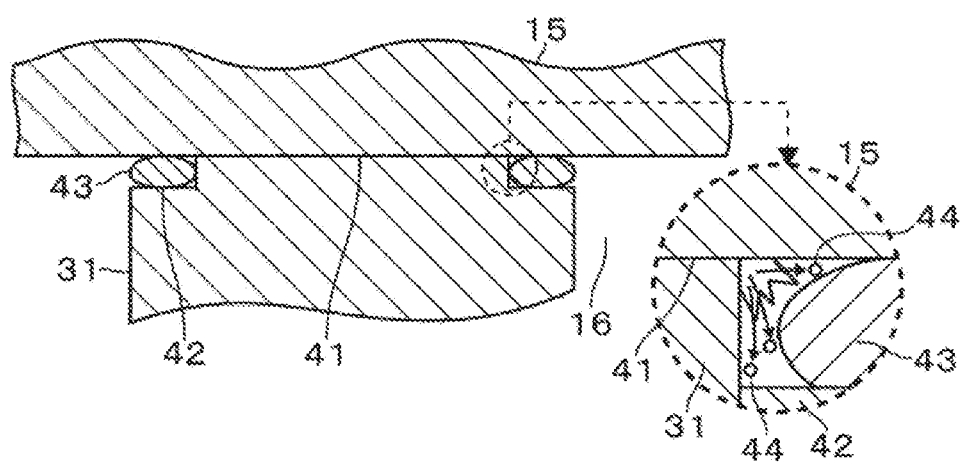
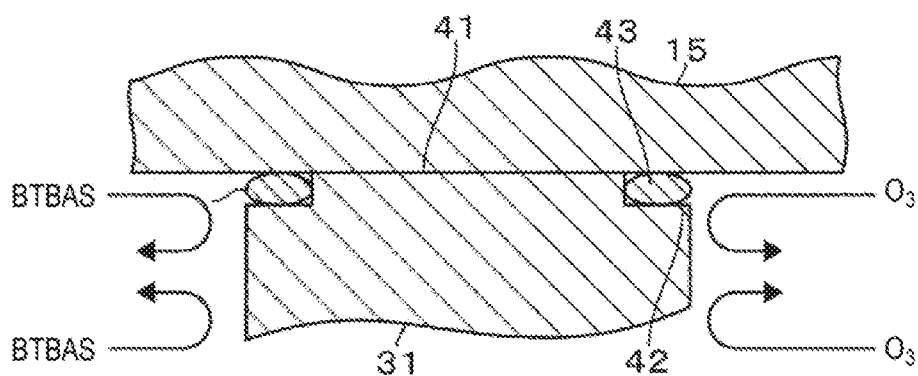

SUBSTRATE PROCESSING APPARATUS HAVING A PILLAR SUPPORT STRUCTURE FOR PREVENTING TRANSFORMATION OF A CEILING PORTION

CROSS-REFERENCE TO RELATED APPLICATION

This application claims the benefit of Japanese Patent Application No. 2015-020536, filed on Feb. 4, 2015, in the Japan Patent Office, the disclosure of which is incorporated herein in its entirety by reference.

TECHNICAL FIELD

The present disclosure relates to a substrate processing apparatus which performs a process by supplying gas to a substrate mounted on a rotary table in a vacuum container.

BACKGROUND

As a method of forming a thin film such as a silicon oxide film ($SiO_2$) on a substrate such as a semiconductor wafer (hereinafter, referred to as "wafer"), there is known a film formation apparatus which performs ALD (Atomic Layer Deposition). In such a film formation apparatus, a horizontal rotary table is installed inside a processing container (vacuum container) whose interior is kept in a vacuum atmosphere by exhaustion, and the wafer is mounted on the rotary table.

A raw material gas supply part and a reactant gas supply pail are disposed above the rotary table, while being spaced apart from each other in a circumferential direction of the rotary direction. The raw material gas supply part supplies a raw material gas containing a raw material of the thin film, and the reactant gas supply part supplies a reactant gas reacting with the raw material gas adsorbed onto the wafer. The wafer revolves with the rotation of the rotary table so that the wafer repeatedly and alternately passes through a raw material gas supply region to which the raw material gas is supplied and a reactant gas supply region to where the reactant gas is supplied. In this way, the ALD method is performed.

A ceiling portion of the vacuum container may be transformed by a difference in pressure between the outside of the vacuum container which is in an atmospheric environment and the inside of the vacuum container which has been vacuum-exhausted. To prevent this, it is considered that the ceiling portion is supported by a pillar formed to extend from a bottom portion of the vacuum container. There is known a film formation apparatus in which such a pillar is installed. However, in such a film formation apparatus, a worker needs to perform maintenance such as the replacement of a degraded part inside the vacuum container. Even in a case where the pillar is installed, the maintenance is required to be easily performed by the worker. The pillar of the film formation apparatus structured as above seems to be installed integrally to the cover part and the bottom portion of the vacuum container. In addition, the conventional apparatus did not disclose how to open the vacuum container and perform the maintenance. This may not be sufficient to meet the requirement.

SUMMARY

Some embodiments of the present disclosure provide a substrate processing apparatus which supplies gas to a substrate mounted on a rotary table inside a vacuum container and performs a process, which is capable of preventing a ceiling portion of the vacuum container from being transformed when the vacuum container is vacuum-exhausted, and of easily performing maintenance on the inside of the vacuum container.

According to an embodiment of the present disclosure, there is provided a substrate processing apparatus of performing a process by supplying a processing gas on a substrate while rotating the substrate mounted on a rotary table in a vacuum container, which includes: a container main body used as a part including a bottom portion of the vacuum container; a cover part configured to be detachably installed with respect to the container main body to open and close the container main body, the cover part being used as a part including a ceiling portion of the vacuum container; a pillar installed in one of the cover part and the container main body such that the pillar penetrates through a central portion of the rotary table when the cover pail is installed on the container main body, and configured to support the cover part with respect to the container main body when the inside of the vacuum container is vacuum-exhausted.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 4 is a vertical sectional view showing an upper end portion of a pillar constituting the film formation apparatus.

DETAILED DESCRIPTION

Figure 1:
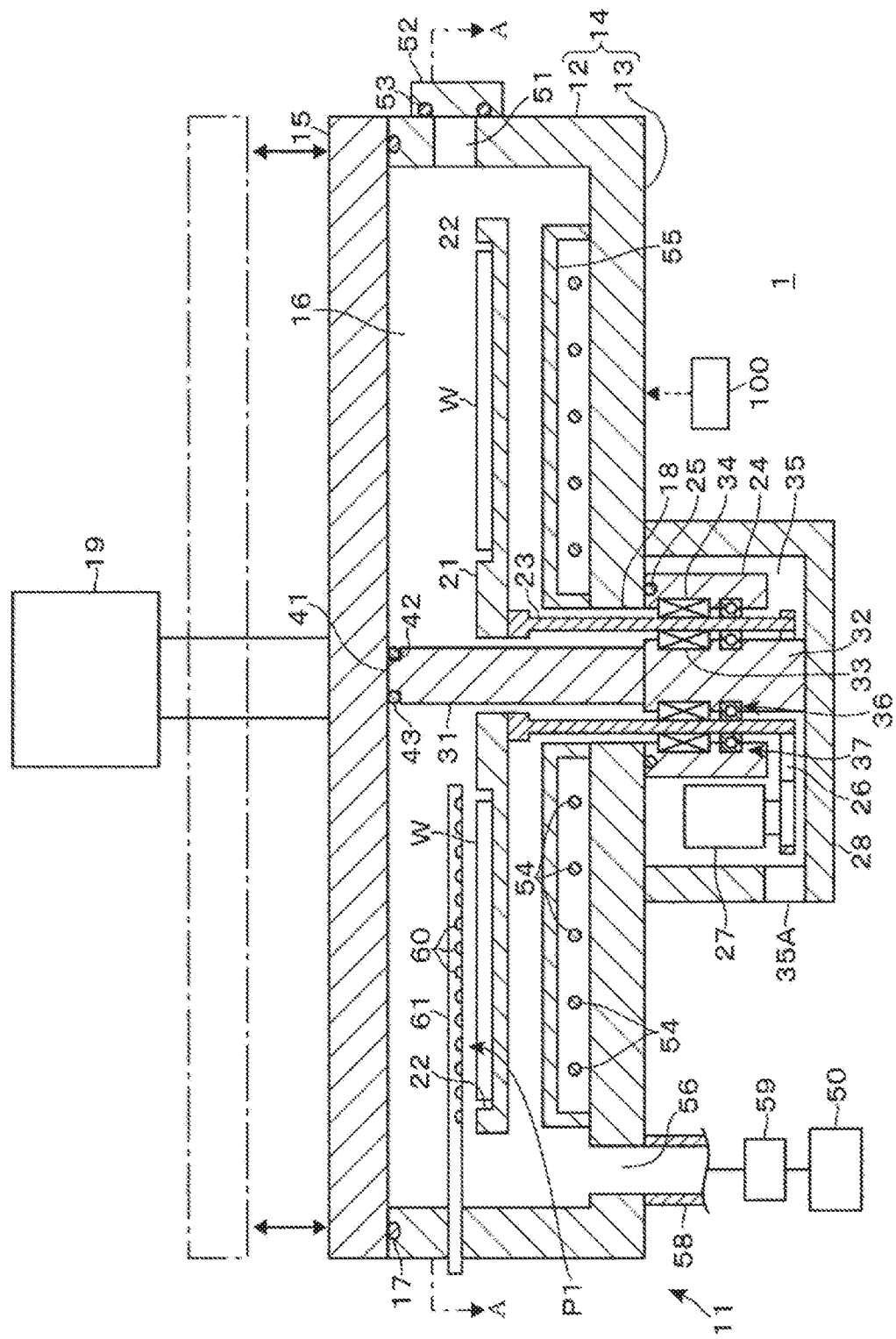
FIG. 1 is a longitudinal sectional view of a film formation apparatus according to a first embodiment of the present disclosure.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

First Embodiment

A film formation apparatus 1 used as a substrate processing apparatus according to a first embodiment of the present disclosure will be described with reference to a longitudinal sectional view of FIG. 1 and a transverse plan view of FIG. 2. The film formation apparatus 1 performs, for example, an ALD method on a wafer W as a substrate to form an $SiO_2$ (silicon oxide) film. FIG. 2 is a cross sectional view taken along a line A-A in FIG. 1. The film formation apparatus 1 includes a substantially circular flat vacuum container (processing container) 11. The vacuum container 11 is formed by, e.g., metal such as aluminum, and is provided with a container main body 14 constructed by a sidewall 12 and a bottom portion 13 of the vacuum container 11, and a substantially circular cover part 15 which constitutes a ceiling portion of the vacuum container 11.

The vacuum container 11 is kept in an atmospheric environment and has a processing space 16 defined therein. The inside of the vacuum container 11 is exhausted through an exhaust port (which will be described later) so that the processing space 16 is kept in a vacuum atmosphere by exhausting in FIG. 1, a reference numeral 17 is an O-ring 17 installed in an upper end of the sidewall 12. The O-ring 17 is installed along the sidewall 12 to create a seal between the sidewall 12 and the cover part 15, thus maintaining airtightness in the processing space 16. The cover part 15 is connected to an elevating mechanism 19 installed outside the vacuum container 11. The cover part 15 moves up and down with respect to the container main body 14 by the elevating mechanism 19 so that the vacuum container 11 is opened and closed. In other words, the cover part 15 is configured to be separated from the container main body 14. In FIG. 1, the state where the cover part 15 is installed on the container main body 14 is indicated by a solid line, and the state where the cover part 15 is separated from the container main body 14 is indicated by a dashed dotted line.

Figure 3:
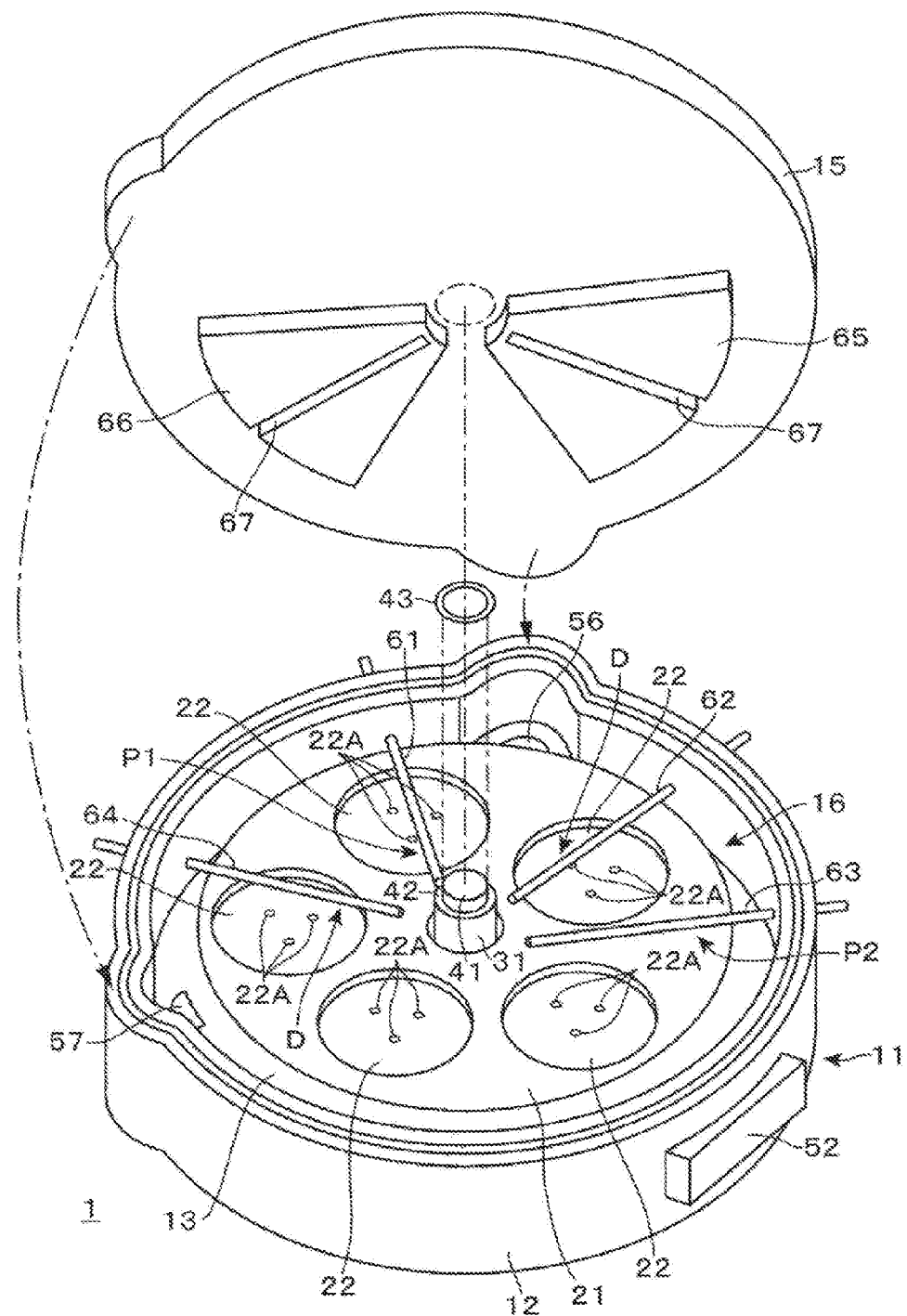
FIG. 3 is a perspective view showing each of a lower side of a cover part and an upper side of a container main body which constitute the film formation apparatus.

FIG. 3 is a perspective view showing the inside of the container main body 14. Descriptions will be now described with reference to FIG. 3. A ring-like horizontal rotary table 21 is installed inside the vacuum container 11. The rotary table 2 has five circular recesses 22 formed on a surface (one surface side) of the rotary table 21 along a circumferential direction thereof. A wafer W is received in the recess 22. In other words, a bottom portion of the recess 22 is defined as a mounting region of the wafer W. In addition, each of the recesses has three through-holes 22A formed to penetrate through the bottom portion of the respective recess 22.

Figure 2:
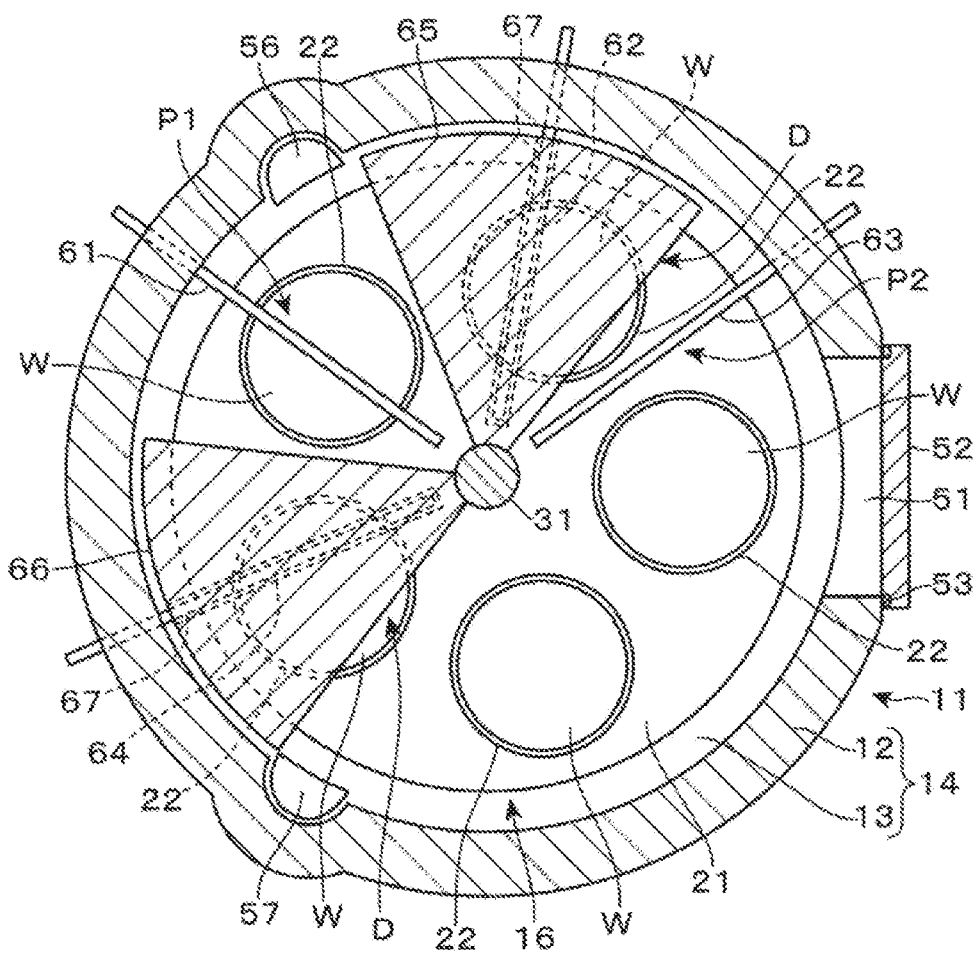
FIG. 2 is a cross sectional view taken along a line A-A in FIG. 1.

An inner peripheral portion of the rotary table 21 extends downward to constitute a vertical rotary cylindrical part 23 (see FIG. 1). A lower end portion of the rotary cylindrical part extends below the bottom portion 13 via a through-hole 18 formed in the central portion of the bottom portion 13 of the container main body 14. A cylindrical body 24 is installed to surround the rotary cylindrical part 23 below the through-hole 18. An upper end of the cylindrical body 24 is connected to a peripheral portion of the through-hole 18 via an O-ring 25 so that the cylindrical body 24 is fixed to the container main body 14.

A lower end portion of the rotary cylindrical part 23 extends downward beyond the cylindrical body 24 and is spanned with a belt 26. The belt 26 is driven by a rotating mechanism 27 equipped with a motor. With the rotation of the belt 26, the rotary cylindrical part rotates about a shaft so that the rotary table 21 is rotated in the circumferential direction thereof. This revolves the wafer W received in the recess 22 about the rotational shaft of the rotary cylindrical part 23 in a clockwise direction when viewed from the top.

Below the bottom portion 13 of the container main body 14, a cup-like bottom portion formation part 28 with its upper side opened is installed to surround the lower portion of the rotary cylindrical part 23, the cylindrical body 24, the belt 26 and the rotating mechanism 27. An upper end of the bottom portion formation part 28 is in contact with a lower surface of the bottom portion 13 of the container main body 14 so that the through-hole 18 is blocked by the bottom portion formation part 28. In other words, the bottom portion formation part 28 forms a bottom central portion of the container main body 14. A cylindrical pillar 31 is installed to vertically extend beyond the rotary table 21 through the rotary cylindrical part 23 from the bottom portion formation part 8. An upper end of the pillar 31 is brought into contact with a bottom central portion of the cover part 15 to support the cover part 15. Therefore, the pillar 31 is installed to vertically pass through a rotation central portion of the rotary table 21. The pillar 31 is formed of, e.g., metal such as aluminum.

A lower portion of the pillar 31 constitutes a larger diameter portion 32 having a diameter larger than that of an upper portion thereof. Seal members 33 and 34 are installed to block a gap between an outer peripheral surface of the larger diameter portion 32 and an inner peripheral surface of the rotary cylindrical part 23, and a gap between an outer peripheral surface of the rotary cylindrical part 23 and an inner peripheral surface of the cylindrical body 24, respectively. Each of the seal members 33 and 34, which is formed of a magnetic fluid seal, are installed such that the rotary cylindrical part 23 can rotate as described above. A space 35 partitioned from the processing space 16 by the seal members 33 and 34 is formed inside the bottom portion formation part 28. Further, in the space 35, a bearing 36 is installed between the pillar 31 and the rotary cylindrical part 23, and a bearing 37 is installed between the rotary cylindrical part 23 and the cylindrical body 24. By the bearings 36 and 37, the rotary cylindrical part 23 is supported by both the pillar 31 and the cylindrical body 24 and is rotated as described above.

The bearings 36 and 37, the belt 26 and the rotating mechanism 27 are disposed in the space 35. The space 35 is in communication with a space outside the vacuum container 11 through an opening 35A formed in the bottom portion formation part 28. Thus, the space 35 is kept in the atmospheric environment. The opening 35A is formed to perform maintenance of the belt 26 and the rotating mechanism 27, or to suppress a change in internal pressure of the space 35 with a change in temperature of the vacuum container 11.

In addition, in this embodiment, the seal members 33 and 34 are installed below the inner peripheral portion of the bottom portion 13 of the container main body 14. With this configuration, it is possible to suppress heat generated from heaters 54 (which will be described later) installed on the bottom portion 13 from being radiated to the seal members 33 and 34 through the bottom portion 13. This suppresses the seal members 33 and 34 from being degraded due to an increase in temperature thereof.

Next, an upper end portion of the pillar 31 will be described with reference to FIG. 4. An upper stage in FIG. 4 shows a state where the cover part 15 is removed from the container main body 14 so that the container main body 14 and the cover part 15 are separated from each other. The upper end portion of the pillar 31 has a circular horizontal mounting surface 41 formed therein. Further, the upper end portion of the pillar 31 has a ring-like stepped portion formed to surround the mounting surface 41. This stepped portion forms a ring-like horizontal mounting surface 42 which is lower than a level of the mounting surface 41. An O-ring 43 as a seal member made of an elastic body such as rubber is mounted on the mounting surface 42 along the mounting surface 42. In other words, the O-ring 43 is disposed in the stepped portion formed by the mounting surface 41 and the mounting surface 42. As shown in FIG. 4, in a state where the cover part 15 is separated from the container main body 14, an upper end of the O-ring 43 mounted on the mounting surface 42 is higher than a level of the mounting surface 41.

The cover part 15 moves downward with the operation of the elevating mechanism 19 at the state of the upper stage in FIG. 4 so that the cover part 15 is mounted on the container main body 14. Then, the O-ring 43 is crushed and transformed by the cover part 15. And, the O-ring 43 closely adheres to the cover part 15 and the mounting surface 42 by virtue of a restoration force of the O-ring 43. Subsequently, if the cover part 15 moves further downward, the mounting surface 41 is brought into contact with the lower central surface of the cover part 15 so that the cover part 15 is mounted on the mounting surface 41. In other words, the mounting surface 41 is defined as a contact surface at which the mounting surface 41 is in contact with the cover part 15.

The middle stage in FIG. 4 shows a state where the cover part 15 is mounted on the mounting surface 42 as described above. The vicinity of an inner side of the O-ring 43 is scaled up as shown by a dotted line in the right side of the middle stage. As shown in the middle stage of FIG. 4, since the O-ring 43 closely adheres to the cover part 15, even if particles 44 are generated when the cover part 15 is brought into contact with the muffling surface 42, the particles 44 is prevented from being scattered into the processing space 16. Further, the O-ring 43 seals a gap between the pillar 31 and the cover part 15, thus having a function of preventing a BTBAS gas and an $O_3$ gas (which will be described later) from coming into contact with each other in the gap. When the bottom central portion of the cover part 15 is mounted on the mounting surface 42, the peripheral portion of the cover part 15 is mounted on an upper end of the sidewall 12 of the container main body 14. Thus, the cover part 15 is installed on the container main body 14 as showed in FIG. 1. In this state, the processing space 16 is vacuum-exhausted.

In the film formation apparatus 1 configured as above, if the pillar 31 is not installed, the cover part 15 may be stressed by an atmospheric pressure around the vacuum container 11 when the processing space 16 is vacuum-exhausted. Such a stress may transform the central portion of the cover part 15 to be pushed downward. This makes it impossible to form a film having a desired thickness on the wafer W. Further, the transformation increases a variation in in-plane film thickness of the wafer W. To address these concerns, it is considered that the film thickness of the cover part 15 is increased to boost the strength of the cover part 15. However, this increases the weight of the cover part 15. As a result, the load of the elevating mechanism 19 is increased so that the elevating mechanism 19 becomes bulky, thus upsizing the film formation apparatus 1. In the film formation apparatus 1 of the present disclosure, since the central portion of the cover part 15 is supported by the pillar 31, it is possible to prevent the cover part 15 from being transformed, while suppressing an increase in the film thickness of the cover part 15.

Descriptions will be continuously described with FIGS. 1 to 3. A transfer port 51 through which the wafer W is transferred, is formed in the sidewall 12 of the vacuum container 11. The transfer port 51 is opened and closed by a gate valve 52. A transfer mechanism (not shown) configured to transfer the wafer W can be moved between the outside of the vacuum container 11 and the processing space 16 of the vacuum container 11 through the transfer port 51. In FIG. 1, a reference numeral 53 is an O-ring 53 formed to surround the transfer port 51, which seals a gap between the gate valve 52 and the sidewall 12 of the vacuum container 11.

In addition, three elevating pins (not shown) are installed in the bottom portion 13 of the vacuum container 11. Leading ends of the elevating pins are configured to move up and down while passing through the rotary table 21 by an elevating mechanism (not shown) through the through-holes 22A formed in each of the recesses 22 of the rotary table 21. In this way, the wafer W is delivered between the aforementioned transfer mechanism of the wafer W and the respective recess 22.

A plurality of ring-like heaters 54 is installed on the bottom portion 13 of the container main body 14. Each of the heaters 54 is arranged in a concentric circle pattern centered at the rotational shaft of the rotary table 21. The wafer W mounted on the rotary table 21 is heated by the heaters 54. In FIG. 1, a reference numeral 55 is a heater cover installed to cover the heaters 54.

Exhaust ports 56 and 57 are formed outside the heater cover 55 in the bottom portion 13 of the container main body 14. The exhaust port 56 is connected to one end of an exhaust pipe 58 (see FIG. 1). The other end of the exhaust pipe 58 is coupled to an exhaust mechanism 50 equipped with a vacuum pump through an exhaust amount adjusting part 59 including a valve. Although not shown, the exhaust port 57 is connected to one end of the exhaust pipe 58 in which the exhaust amount adjusting part 59 is installed. The other end of the exhaust pipe 58 connected to the exhaust port 57 is coupled to the exhaust mechanism 50.

As shown in FIG. 3, a first processing gas nozzle 61, a separation gas nozzle 62, a second processing gas nozzle 63 and a separation gas nozzle 64 are disposed above the rotary table 21, each of which being formed in a rod shape and extending from an outer periphery of the rotary table 21 toward the center thereof. These nozzles 61 to 64 are arranged in the circumferential direction in that order. Each of the gas nozzles 61 to 64 has a plurality of discharge holes 60 formed therein along a diameter of the rotary table 2. Gas is discharged downward through the respective discharge holes 60. The first processing gas nozzle 61 as a first processing gas supply part discharges a BTBAS (bis-tertiary butyl amino silane) gas, and the second processing gas nozzle 63 as a second processing gas supply part discharges an $O_3$ (ozone) gas. The BTBAS gas is a raw material gas used as a raw material of a $SiO_2$ film, and the $O_3$ gas is a reactant gas used in oxidizing the raw material gas. Each of the separation gas nozzles 62 and 64 discharges a $N_2$ (nitrogen) gas as a separation gas for separating atmosphere.

In addition, the cover part 15 of the vacuum container 11I includes downwardly-protruded portions 65 and 66 which are formed in a fan-shape when viewed from the top. The protruded portions 65 and 66 are formed to be spaced apart at an interval in the circumferential direction of the vacuum container 11. When the cover part 15 is installed on the container main body 14, the protruded portion 65 and 66 are in contact with the pillar 31. The protruded portion 65 and 66 are formed in a shape spreading outward in the circumferential direction of the rotary table 21 as it goes from the pillar 31 outward of the rotary table 21. Each of the protruded portions 65 and 66 has a groove 67. The groove 67 is formed to divide each of the protruded portion 65 and 66 to two parts in the circumferential direction. The separation gas nozzles 62 and 64 as separation gas supply parts are received in the respective grooves 67. A gas supply region defined below the first processing gas nozzle 61 is referred to as a first processing region P1 and a gas supply region defined below the second processing gas nozzle 63 is referred to as a second processing region P2. Regions defined below the protruded portions 65 and 67 are referred to as separation regions D and D to which the $N_2$ gas is supplied from the separation gas nozzles 62 and 64, respectively.

The arrangement of the exhaust ports 56 and 57 will be additionally described. As shown in FIG. 2, the exhaust ports 56 and 57 are formed outside the rotary table 21. When viewed in a clockwise rotation in the circumferential direction of the vacuum container 11, the exhaust port 56 is formed between the protruded portion 66 and the protruded portion 65, and the exhaust port 57 is formed between the protruded portion 65 and the protruded portion 66. With this arrangement, the exhaust port 56 can exhaust the BTBAS gas supplied to the first processing region P1 together with the $N_2$ gas therethrough, and the exhaust port 57 can exhaust the $O_3$ gas supplied to the second processing region P2 together with the separation gas therethrough.

As shown in FIG. 1, the film formation apparatus 1 is provided with a control part 100 including a computer for controlling the operation of the apparatus 1 as a whole. A program to be used in performing a film formation process (which will be described later) on the wafer W is stored in the control part 100. The program causes a control signal to be transmitted to respective parts of the film formation apparatus 1, thus controlling the operation of the respective parts.

Specifically, various operations such as the supply of gas from a gas supply source (not shown) to the respective gas nozzles 61 to 64, the control of a rotational velocity of the rotary table 2 by the rotating mechanism 27, the adjustment of the exhaust amount through the respective exhaust ports 56 and 57 by the exhaust amount adjusting part 59, the up-down movement of the elevating pins, the up-down movement of the cover part 15, the supply of power to the heater 54, or the like, are controlled. The program stores steps allowing respective processes (which will be described later) to be executed by controlling the operations. The program is stored in a storage medium such a hard disk, a compact disk, a magnetic optical disk, a memory card, a flexible disk or the like, and is installed on a computer from the storage medium, and is installed in the control part 100 from the storage medium.

Next, the film formation process performed in the film formation apparatus 1 will be described. In a state where the cover part 15 is installed on the container main body 14, the gate valve 52 is opened and the wafers W are sequentially transferred into the vacuum container 11 by the transfer mechanism of the wafer W and then delivered in the respective recesses 22. Subsequently, the gate valve 52 is closed, and the vacuum container 11 is exhausted so that the inside of the vacuum container 11 is kept in a vacuum atmosphere of a predetermined pressure. And, the rotary table 21 is rotated. The $N_2$ gas is discharged from each of the separation gas nozzles 62 and 64. The BTBAS gas is discharged from the first processing gas nozzle 61 and the $O_3$ gas is discharged from the second processing gas nozzle 63.

The wafers W alternately pass through the first processing region P1 defined below the first processing gas nozzle 61 and the second processing region P2 defined below the second processing gas nozzle 63. Then, the BTBAS gas is adsorbed onto the wafer W and subsequently, the adsorbed BTBAS gas is oxidized with the $O_3$ gas, so that one or more molecular layers of a silicon oxide are formed on the wafer W. The rotary table 21 continues to rotate so that the wafer W repeatedly passes through the first processing region P1 and the second processing region P2. Thus, the aforementioned molecular layers of the silicon oxide are sequentially stacked to form the $SiO_2$ film.

Figure 5:
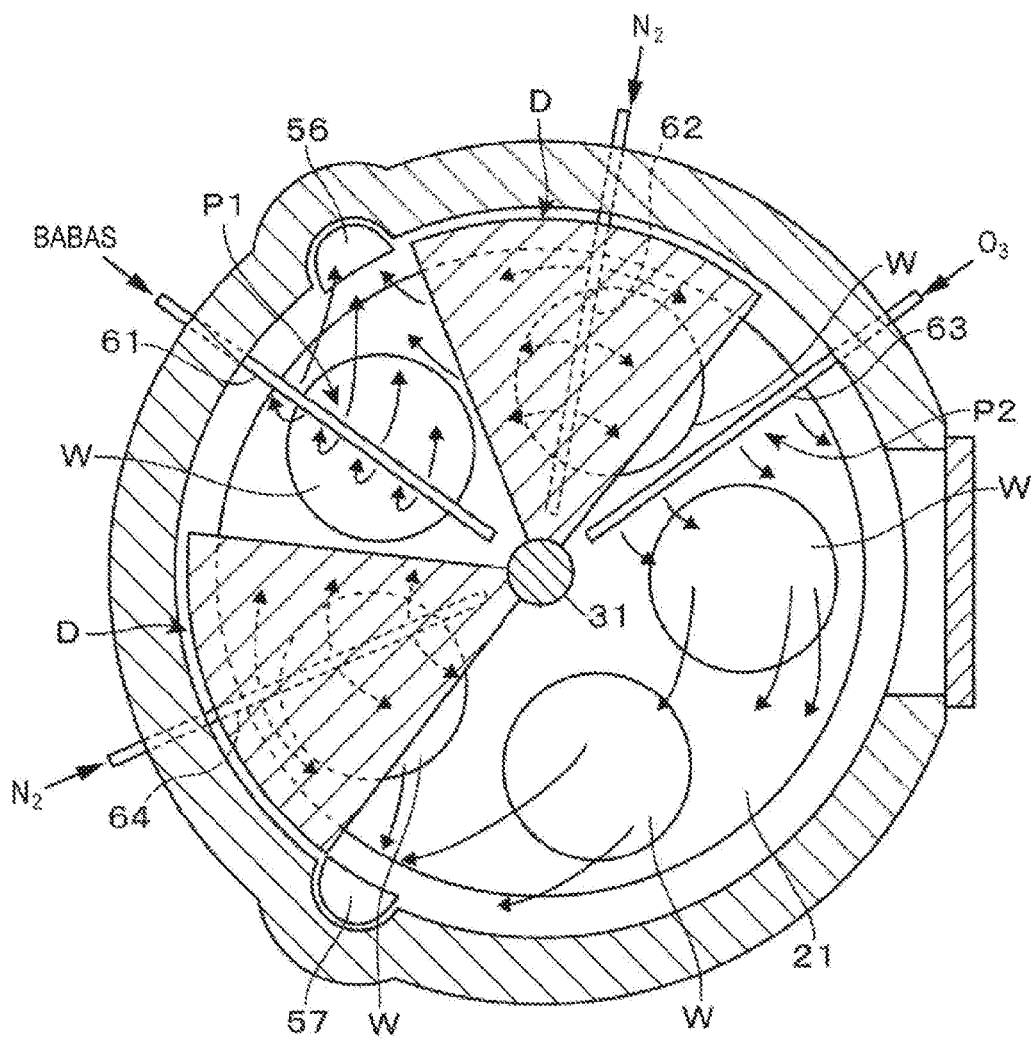
FIG. 5 is a view showing a flow of gas in the film formation apparatus.

FIG. 5 shows a flow of gas in the vacuum container 11 as indicated by an arrow. The $N_2$ gas supplied to the separation region D from each of the separation gas nozzles 62 and 64 spread in the circumferential direction within separation region D, so that the $N_2$ gas is prevented from being contacted with each of the BTBAS gas and the $O_3$ gas flowing over the rotary table 21 in the circumferential direction. In addition, as shown in a lower stage of FIG. 4, the BTBAS gas and the $O_3$ gas is prevented from coming into contact with each other by the pillar 31 in the central portion of the rotary table 21.

After a silicon nitride film of a predetermined film thickness is formed by rotating the rotary table 21 a predetermined number of times, the supply of the processing gas from the first and second processing gas nozzles 61 and 63, and the supply of the $N_2$ gas from the separation gas nozzles 62 and 64 are stopped. Subsequently, the rotation of the rotary table 21 is stopped, and the gate valve 52 is opened so that the wafers W are sequentially unloaded from the vacuum container 11 by the transfer mechanism (not shown) and the elevating pins. In this way, the film formation processing is finished.

In order to perform maintenance on the inside of the vacuum container 11, the cover part 15 is lifted up by the elevating mechanism 19 to be separated from the container main body 17 after the aforementioned film formation process. Upon completing the maintenance, as shown in the upper and middle stages of FIG. 4, the cover part 15 moves downward so that the cover part 15 is installed on the container main body 14. After the installation, subsequent wafers W are loaded into the vacuum container 11 where the film formation process is performed.

According to the film formation apparatus 1, the pillar 31 configured to support the bottom central portion of the cover part 15 is installed in the container main body 14, and the cover part 15 is configured to be detachably installed on the pillar 31 and the sidewall 12 of the container main body 14. With this configuration, it is possible to suppress the cover part 15 from being transformed due to the difference in pressure between the inside and the outside of the vacuum container 11. Further, the vacuum container 11 is configured to be opened or closed by removing the cover part 15 from the container main body 14 or by installing the cover part 15 on the container main body 14. This facilitates the maintenance of the inside of the vacuum container 11. However, in the film formation apparatus 1, since the plurality of wafers W are mounted on the rotary table 21 in the horizontal direction, the area of the cover part 15 is relatively large when viewed from the top. In this case, a relatively strong stress may be applied on the central portion of the cover part 15 by the aforementioned difference between the atmospheric pressure and the internal pressure of the processing space 16. This transforms the cover part 15. Thus, the installation of the pillar 31 is particularly effective.

Furthermore, since the pillar 31 is installed in the film formation apparatus 1, it is possible to prevent the BTBAS gas and the $O_3$ gas from coming into contact with each other at the central portion of the rotary table 21. This suppresses the generation of the particles. Alternatively, instead of installing the pillar 31, a purge gas may be supplied to the central portion of the rotary table 21 to suppress the contact of the BTBAS gas with the $O_3$ gas. However, according to the film formation apparatus 1, since the BTBAS gas and the $O_3$ gas are not diluted with such a purge gas, it is possible to restrict use of the BTBAS gas and the $O_3$ gas, compared to the case of using the purge gas.

Second Embodiment

Figure 6:
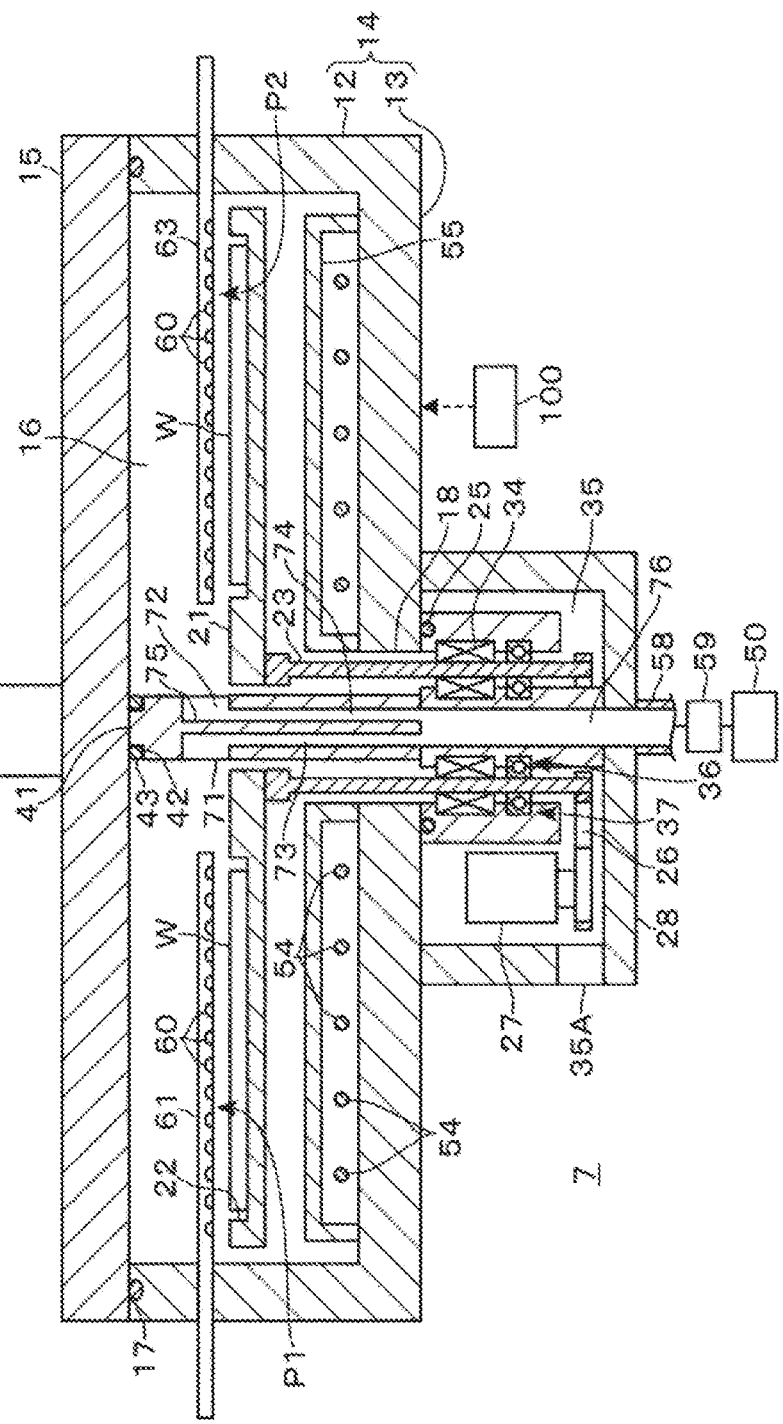
FIG. 6 is the longitudinal sectional view of a film formation apparatus according to a second embodiment of the present disclosure.
Figure 7:
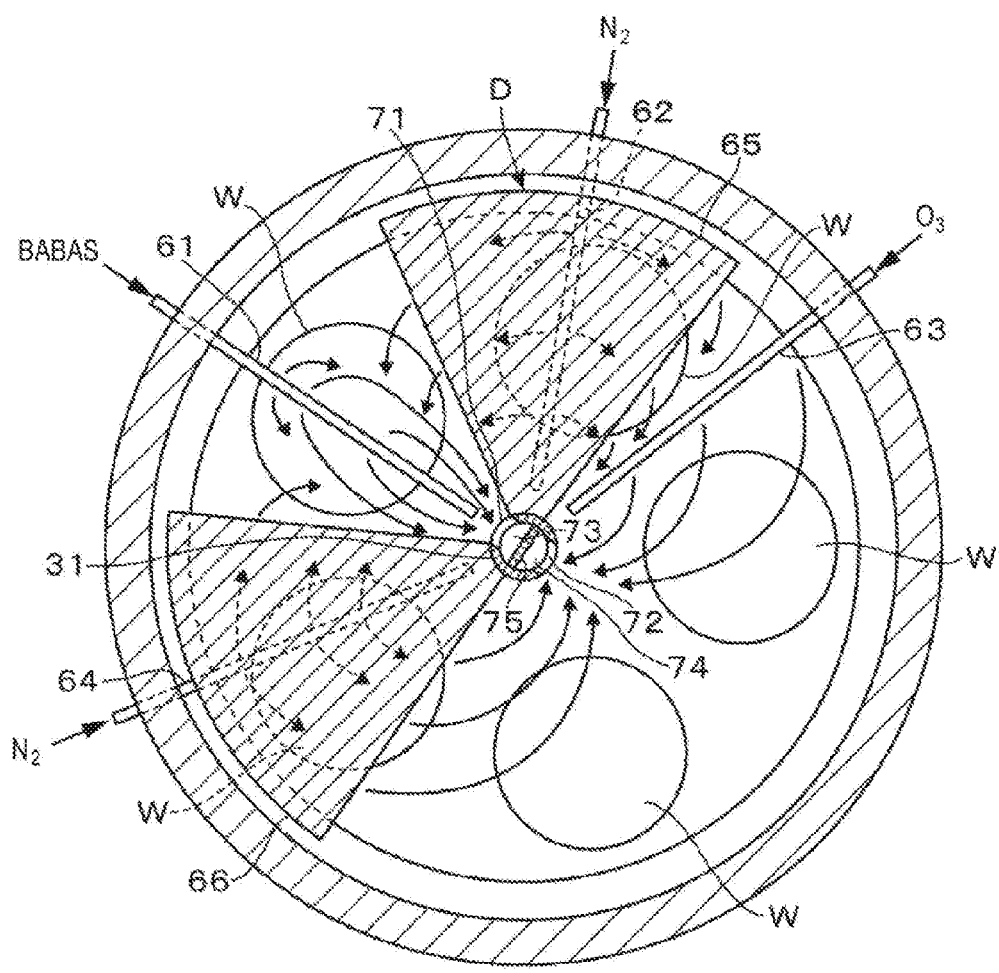
FIG. 7 is a view shown a flow of gas in the film formation apparatus.

A film formation apparatus 7 according to a second embodiment will be described with reference to FIGS. 6 and 7, with a focus on the differences from the film formation apparatus 1 according to the first embodiment. FIG. 6 is a longitudinal sectional view of the film formation apparatus 7 and FIG. 7 is a schematic transverse plan view of the film formation apparatus 7. In FIG. 7, a flow of each gas at the time of the film formation process is indicated by an arrow like FIG. 5.

In the film formation apparatus 7, instead of installing the exhaust ports 56 and 57 in the bottom portion 13 of the container main body 14, exhaust ports 71 and 72 are formed in a lateral side of the pillar 31. When viewed in the clockwise fashion in the circumferential direction of the vacuum container 11, the exhaust port 71 is formed between the protruded portion 66 and the protruded portion 65, and the exhaust port 72 is formed between the protruded portion 65 and the protruded portion 66. Gas channels 73 and 74 which are respectively in communication with the exhaust ports 71 and 72 are formed inside the pillar 31. The gas channels 73 and 74 are partitioned by a partition plate 75 installed to vertically extend within the pillar 31. The gas channels 73 and 74 are formed in a longitudinal direction of the pillar 31 and are jointed in the middle portion of the pillar 31, thus forming a gas channel 76. The gas channel 76 is formed to further extend downward within the pillar 31.

In the bottom portion formation part 28, one end of the exhaust pipe 58 is connected to be in communication with the gas channel 76 and the other end of the exhaust pipe 58 is coupled to the exhaust mechanism 50 through the exhaust amount adjusting part 59. With this configuration, it is possible to exhaust the BTBAS gas supplied to the first processing region P1 through the exhaust port 71 together with $N_2$ gas, and to exhaust the $O_3$ gas supplied to the second processing region P2 through the exhaust port 72 together with the $N_2$ gas. In other words, the exhaust port 71 is configured to restrictively exhaust the BTBAS gas among the BTBAS gas and the $O_3$ gas, and the exhaust port 72 is configured to restrictively exhaust the $O_3$ gas among the BTBAS gas and the $O_3$ gas. The partition plate 75 is provided to prevent particles generated when the BTBAS gas and the $O_3$ gas contact with each other in the vicinity of the exhaust ports 71 and 72 from being scattered toward the processing space 16, for the exhaust process as described above.

The film formation apparatus 7 has effects similar to those of the film formation apparatus 1. According to the film formation apparatus 7, the installation of the exhaust ports 71 and 72 in the pillar 31 eliminates the need to form exhaust ports in the container main body 14. This downsizes the film formation apparatus 7.

Figure 8:
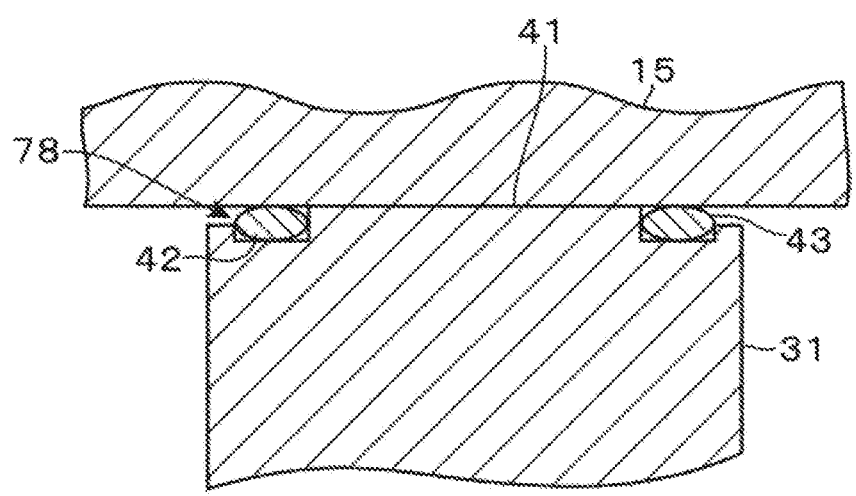
FIG. 8 is a view showing another example of the upper end portion of the pillar.

In some embodiments, as shown in FIG. 8, an annular recess 78 may be formed around the mounting surface 41 in the aforementioned pillar 31 and the O-ring 43 may be installed in the recess 78. A bottom surface of the recess 78 constitutes the aforementioned mounting surface 42. Further, an upper end surface formed by an inner sidewall of the annular recess 78 in the pillar 31 constitutes the mounting surface 41 on which the cover part 15 is muffled. An upper end surface formed by an outer sidewall of the annular recess 78 is formed lower than a level of the mounting surface 41 so that it is not brought into contact with the cover part 15.

While in the film formation apparatuses 1 and 7 mentioned above, the cover part 15 has been described to move up and down with respect to the container main body 14 so that the cover part 15 is installed on and separated from the container main body 14, the container main body 14 may be configured to move up and down with respect to the cover part 15.

Figure 9:
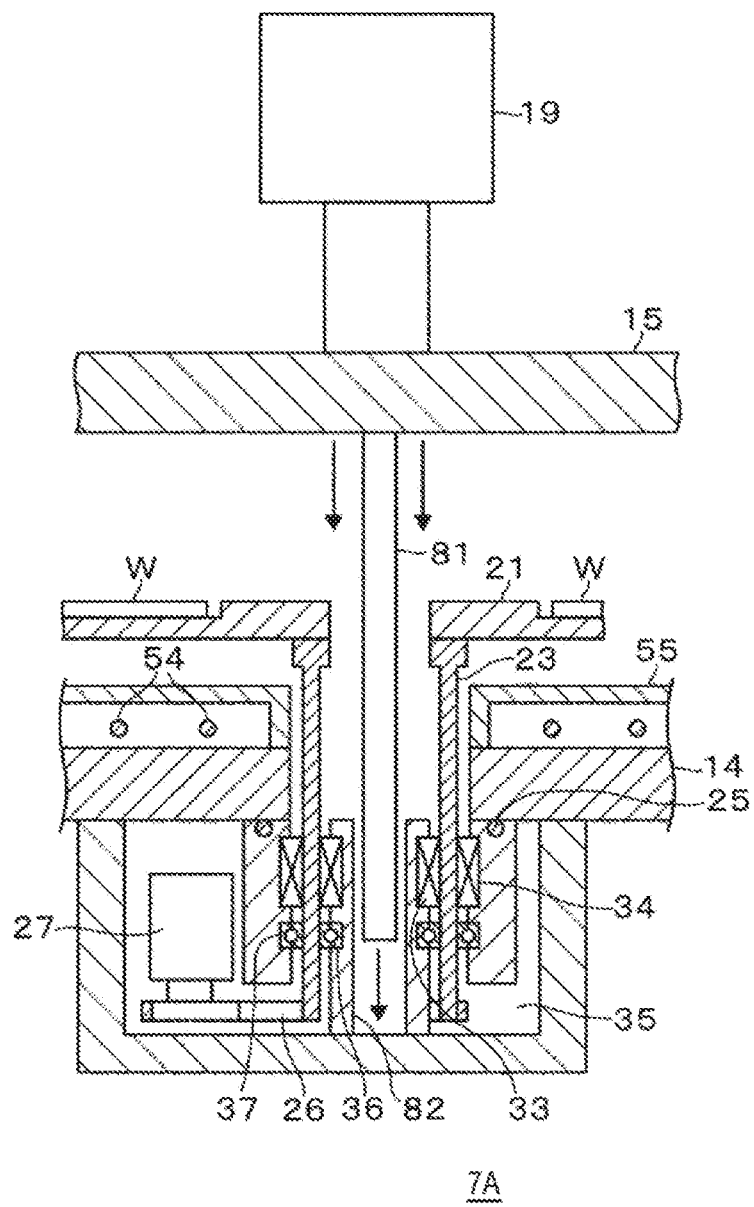
FIG. 9 is a longitudinal sectional view showing one modified example of the film formation apparatus.

In addition, the pillar is not limited to being installed to the container main body 14 and may be installed in the cover part 15. FIG. 9 shows a configuration of a film formation apparatus 7A according to one modified example in which a pillar 81 is formed to extend downward from the bottom central portion of the cover part 15. In the film formation apparatus 7A of FIG. 9, the seal member 33 and the bearing 36 are installed in a gap between a cylindrical body 82 which is installed to stand up inside the rotary cylindrical part 23 and the rotary cylindrical part 23, instead of installing in the gap between the pillar 31 and the rotary cylindrical part 23. The rotary cylindrical part 23 is supported by the cylindrical body 82 instead of the pillar 31.

In a case where the cover part 15 is installed on the container main body 14, the cover part 15 moves downward and a lower end portion of the pillar 81 is inserted into the cylindrical body 82 from the top. Subsequently, the cover part 15 further moves downward so that the bottom end of the pillar 81 is brought into contact with the bottom portion formation part 28. Thus, the cover part 15 is supported on the bottom portion formation part 28 through the pillar 81 and also is supported on the sidewall 12 of the container main body 14 so that the cover part 15 is installed on the container main body 14.

Figure 10:
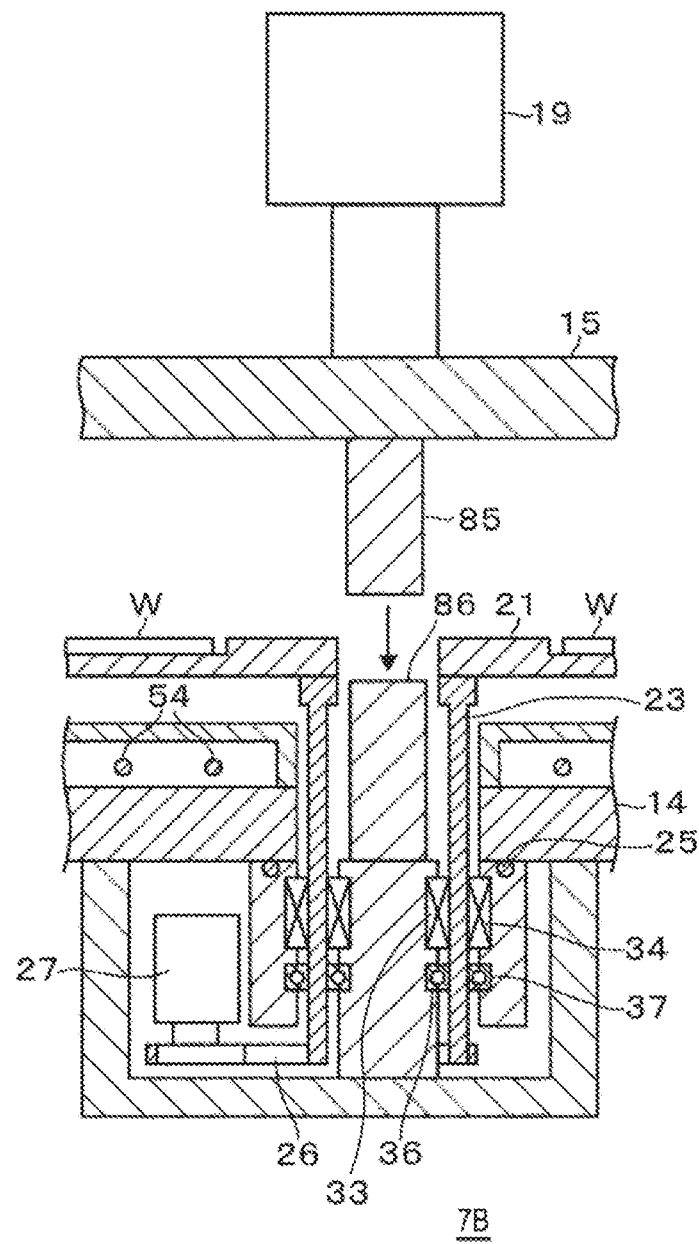
FIG. 10 is a longitudinal sectional view showing another modified example of the film formation apparatus.

FIG. 10 shows a configuration of a film formation apparatus 7B according to another modified example. In FIG. 10, a pillar 85 is installed in the cover part 15 and a pillar 86 is installed in the container main body 14. In a case where the cover part 15 is installed on the container main body 14, a bottom end of the pillar 85 is brought into contact with an upper end of the pillar 86 so that a configuration similar to that of the pillar 31 is obtained. In other words, in this example, the pillar is divided into two upper and lower pillars. The divided pillars are installed to the cover part 15 and the container main body 14, respectively.

Third Embodiment

Figure 11:
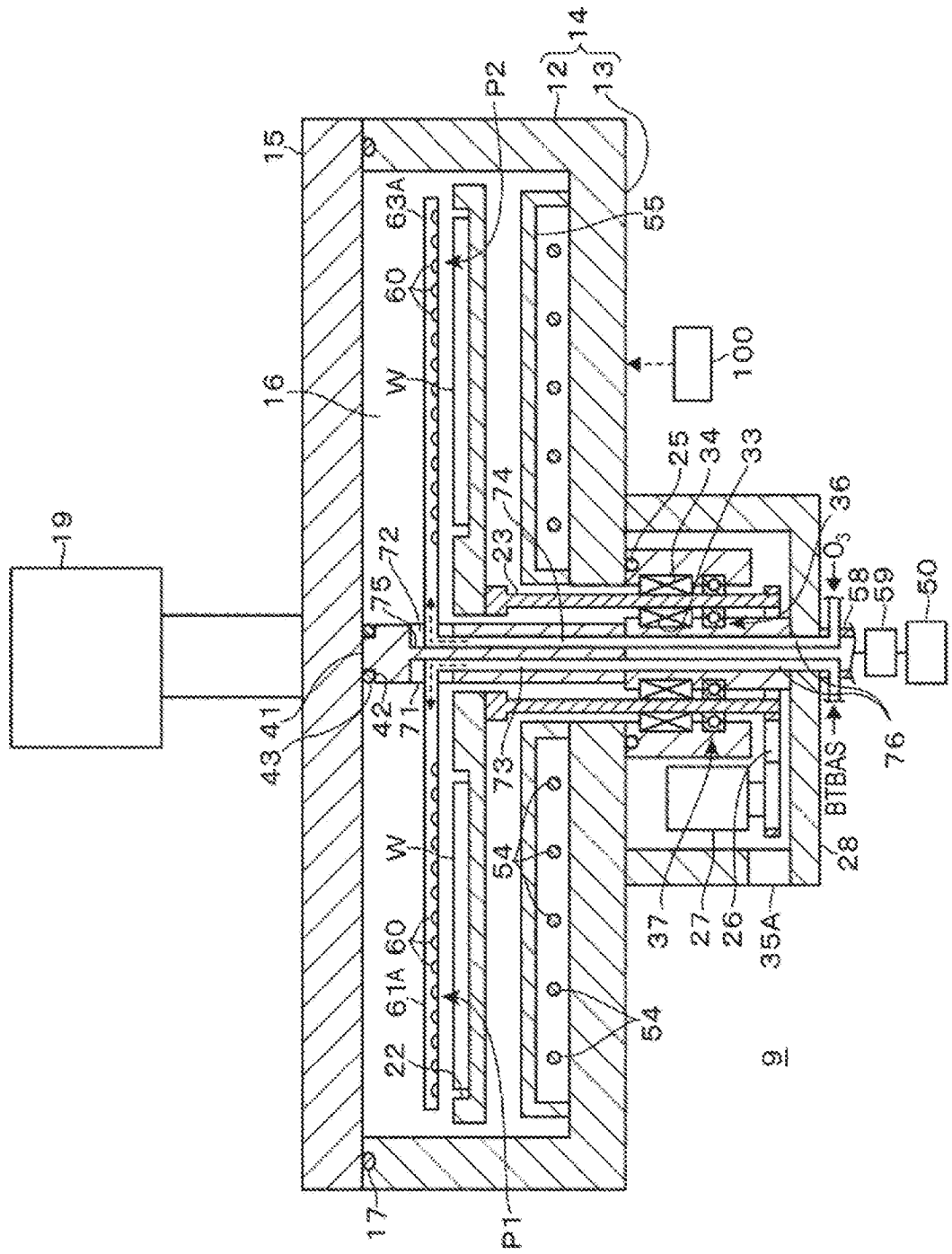
FIG. 11 is a longitudinal sectional view of a film formation apparatus according to a third embodiment of the present disclosure.
Figure 12:
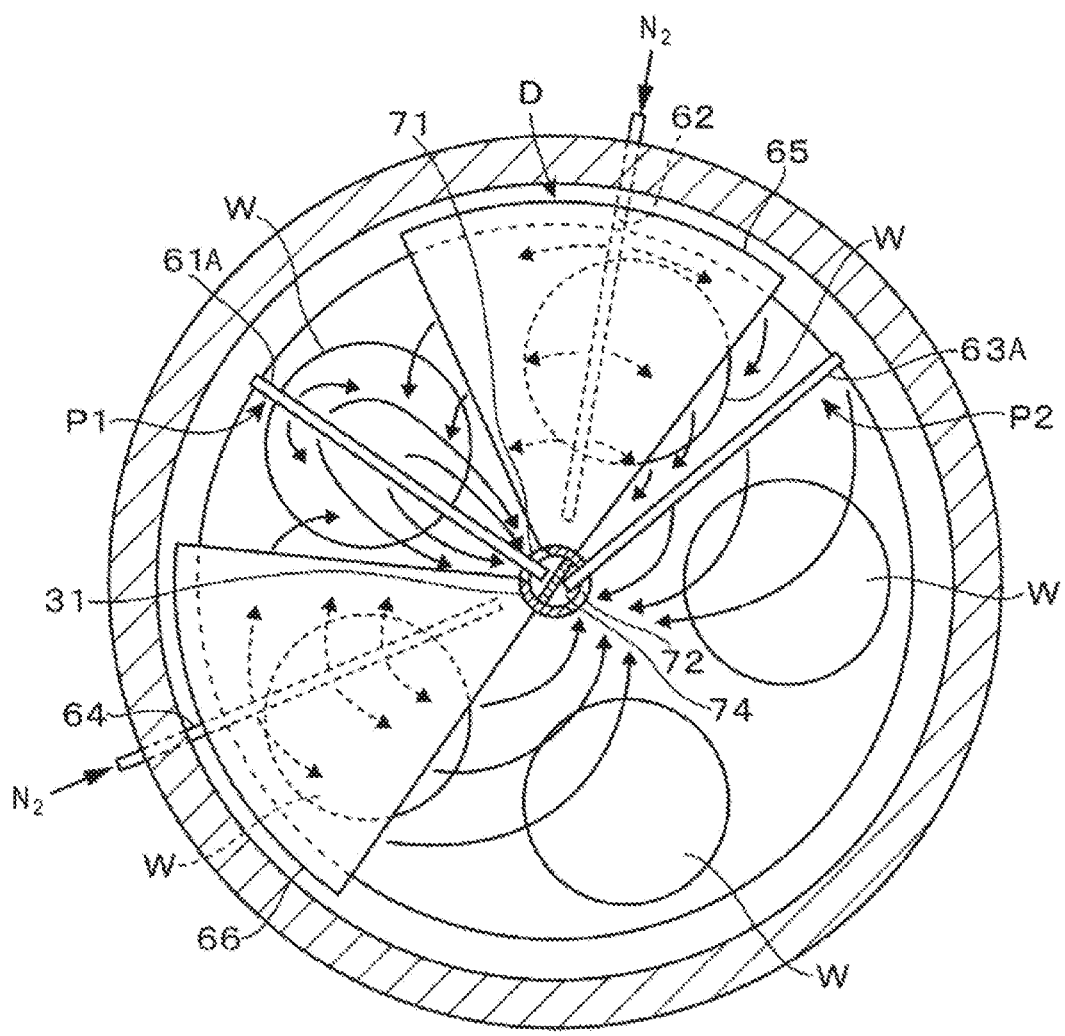
FIG. 12 is a view showing a flow of gas in the film formation apparatus.

Next, a film formation apparatus 9 according to a third embodiment will be described with reference to FIGS. 11 and 12, with a focus on the differences from the film formation apparatus 7 of the second embodiment. FIG. 11 is a longitudinal sectional view of the film formation apparatuses 9 and FIG. 12 is a schematic transverse plan view of the film formation apparatus 9. In FIG. 12, a flow of each gas at the time of the film formation process is indicated by an arrow like FIG. 7. In the film formation apparatus 9, configurations of gas nozzles 61A and 63A are different from those of the gas nozzles 61 and 63 of the film formation apparatus 7.

Even in the film formation apparatus 9, the gas nozzles 61A and 63A are formed in a rod shape. A base end of the gas nozzles 61A and 63A in the film formation apparatus 9 are located outside the exhaust pipe 58 below the bottom portion formation part 28. A leading end of the gas nozzle 61A penetrates horizontally through the exhaust pipe 58, bends inside the exhaust pipe 58, extends upward along a sequence of the gas channels 76 and 73, further bends and horizontally extends toward the periphery of the rotary table 21 through the exhaust port 71. Similarly, a leading end of the gas nozzle 63A penetrates horizontally through the exhaust pipe 58, bends inside the exhaust pipe 58, extends upward along a sequence of the gas channels 76 and 74, further bends, and horizontally extends toward the periphery of the rotary table 21 through the exhaust port 72. Each of the leading ends of the gas nozzles 61A and 63A projected from the exhaust ports 71 and 72 has a plurality of discharge holes 60 formed along the longitudinal direction of each of the gas nozzles 61A and 63A. Thus, the BTBAS gas and the $O_3$ gas can be supplied onto the entire surface of the wafer W which is revolving, like the film formation apparatuses 1 and 7.

As described above, in the film formation apparatus 9, the exhaust channel and the supply channel of the BTBAS gas and the supply channel of the $O_3$ gas are formed in the pillar 31 independently of one another. With this configuration, it is possible to downsize the film formation apparatus 9 like the film formation apparatus 7. Further, respective parts of the apparatuses in the above examples may be combined with each other. As an example, in the film formation apparatus 9, the exhaust ports 56 and 57 may be formed in the bottom portion 13 of the vacuum container 14 like the film formation apparatus 1, and the gas may be exhausted through the exhaust ports 56 and 57 instead of exhausting gas through the exhaust ports 71 and 72.

In addition, the present disclosure is not limited to being applied to the film formation apparatus which performs the ALD method on the wafer W, and may be applied to various processing apparatuses which supply a processing gas to the wafer W and perform a film formation process. As an example, the film formation apparatus 1 may be provided to have a configuration in which the separation region D and the second processing gas nozzle 63 are not installed and the processing gas is supplied from the first processing gas nozzle 61 so that a film formation process based on CVD (Chemical Vapor Deposition) is performed on the wafer W. In some embodiments, in a case where the separation region D and the second processing gas nozzle 63 are not installed, the inert gas may be supplied from the first processing gas nozzle 61 so that a film formed on the wafer W is subjected to an annealing process.

According to the present disclosure in some embodiments, a cover part constituting a ceiling portion of a vacuum container and a container main body constituting a bottom portion of the vacuum container are configured to be separated from each other, and a pillar supporting the cover part with respect to the container main body is installed in one of the cover part and the container main body. This suppresses the ceiling portion of the vacuum container from being transformed when the vacuum container is vacuum-exhausted. Further, the opening and closing of the vacuum container is simple, thus making it easy to perform maintenance on the inside of the vacuum container.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate processing apparatus for performing a process by supplying a processing gas on a substrate while rotating the substrate mounted on a rotary table in a vacuum container, comprising:
   a container main body used as a bottom portion of the vacuum container and having a side wall and a container bottom portion;
   a cover part configured to be detachably installed with respect to the container main body to open and close the container main body, the cover part being used as a ceiling portion of the vacuum container;
   a rotary cylindrical part extending from the rotary table to below the container bottom portion via a through-hole in the container bottom portion, said rotary cylindrical part rotates about a shaft so that the rotary table is rotated in a circumferential direction;
   a bottom portion formation part provided below the container bottom portion to surround a lower portion of the rotary cylindrical part and a bottom end of a pillar, an upper end of the bottom formation part is in contact with a lower surface of the bottom portion of the container main body forming a bottom central portion of the container main body;
   the pillar installed in one of the cover part and the container main body such that the pillar extends through a central portion of the rotary table and the rotary cylindrical part; said pillar extending between a lower surface of the cover part and a bottom of the bottom portion formation part when the cover part is installed on the container main body, and said pillar configured to support the cover part while being supported by the bottom of the bottom portion formation part when the inside of the vacuum container is vacuum-exhausted; said cover part is also supported on the sidewall of the container main body.

2. The substrate processing apparatus of claim 1, wherein the pillar has an annular stepped portion formed to surround a surface at which the pillar is in contact with the one of the cover part and the container main body in which the pillar is not installed;
   wherein, when the cover part is installed on the container main body, a seal member made of an elastic body configured to make contact to the other of the cover part and the container main body, is installed in the annular stepped portion.

3. The substrate processing apparatus of claim 1, wherein the pillar includes an exhaust port through which the inside of the vacuum container is exhausted.

4. The substrate processing apparatus of claim 3, further comprising:
   a first processing gas supply part and a second processing gas supply part installed to be spaced apart from each other in a rotation direction of the rotary table and configured to supply a first processing gas and a second processing gas to the substrate, respectively;

a separation region formed between a first processing region to which the first processing gas is supplied and a second processing region to which the second processing gas is supplied and configured to separate between atmosphere of the first processing region and atmosphere of the second processing region, wherein a separation gas is supplied from a separation gas supply part to the separation region, and wherein the exhaust port includes a first exhaust port and a second exhaust port which are formed independently of one another, the first exhaust port being configured to restrictively exhaust one of the first processing gas and the second processing gas therethrough, and the second exhaust port being configured to restrictively exhaust the other of the first processing gas and the second processing gas therethrough.

5. The substrate processing apparatus of claim 1, wherein the pillar is installed in the container main body.

6. The substrate processing apparatus of claim 1, wherein the pillar includes a supply channel through which the processing gas is supplied.

\* \* \* \* \*